United States Patent [19]

Dudding

[11] 4,408,352
[45] Oct. 4, 1983

[54] HIGH POWER LEVEL MIXER APPARATUS
[75] Inventor: Charles H. Dudding, Marion, Iowa
[73] Assignee: Rockwell International Corporation, El Segundo, Calif.
[21] Appl. No.: 376,858
[22] Filed: May 10, 1982
[51] Int. Cl.³ .............................................. H04B 1/12
[52] U.S. Cl. .................................... 455/295; 455/305; 455/311; 455/317
[58] Field of Search .............. 455/295, 296, 302, 303, 455/305, 306, 311, 313, 317

[56] References Cited

U.S. PATENT DOCUMENTS

| | | | |
|---|---|---|---|
| 2,311,696 | 2/1943 | Rubin | 455/306 |
| 2,964,622 | 12/1960 | Fire | 455/302 |
| 3,168,699 | 2/1965 | Sunstein et al. | 455/303 |
| 3,432,765 | 3/1969 | Gottfried | 455/305 |
| 4,243,955 | 1/1981 | Daniel et al. | 455/303 |

*Primary Examiner*—Marc E. Bookbinder
*Attorney, Agent, or Firm*—Bruce C. Lutz; Howard R. Greenberg; H. Fredrick Hamann

[57] ABSTRACT

The present invention reduces the distortion components produced from high power level mixing through a set of adaptive cancelling circuits which utilize a low power level mixing of the same signals to provide a signal which is adaptively cancelled with a signal representative of the high power level signal including distortion to provide an output signal which comprises substantially only the distortion components found in the high power level signal. These distortion components are then adaptively cancelled or combined with the high power level signal including distortion to provide an output signal which comprises the primary signal and insignificant levels of noise and distortion.

4 Claims, 1 Drawing Figure

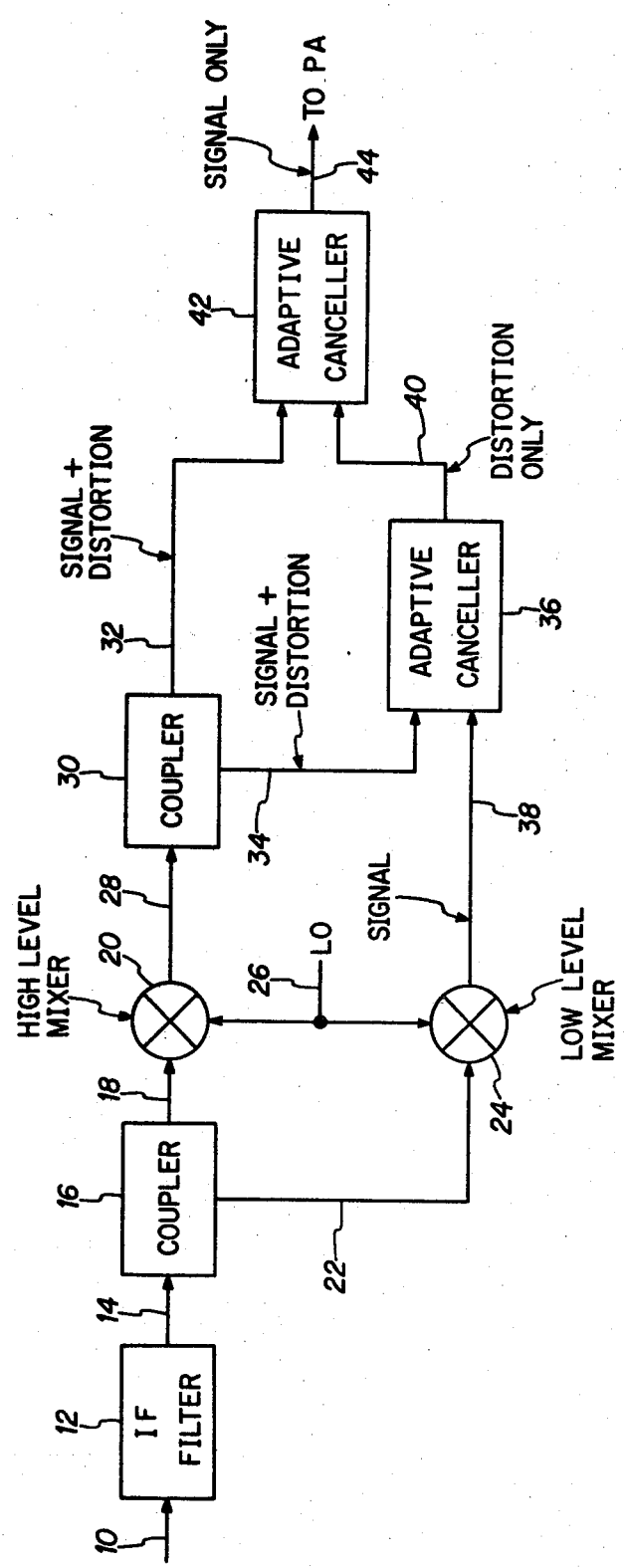

HIGH POWER LEVEL MIXER APPARATUS

THE INVENTION

The present invention refers generally to electronics and more specifically to mixers. Even more specifically, the present invention relates to a mixer which eliminates the distortion normally found when high power level mixing occurs.

When high power level mixing has occurred in the prior art, substantial distortion components have been generated and these distortion components have provided significant problems in the purity of the output signal. Thus, mixing is normally accomplished at low power levels and the resultant signal (including noise) is amplified. However, it is not always possible to commence with low level signals and besides, when a signal is mixed at low power levels, noise can become a relatively significant factor. Thus, the noise components have to be contended with in the resultant signal purity.

The present invention overcomes the problems of high power level mixing by using an attenuated version of the signal to be mixed at high power levels and mixing it at low power levels whereby a signal substantially free of distortion is obtained. This signal is then combined with an attenuated version of the high power level mixed signal which includes signal distortion. By adaptively combining these low power level signals, a resultant signal of distortion only is obtained. If the distortion only signal is raised to an appropriate power level and adaptively combined with the high power level signal including distortion, a resultant signal can be obtained which has insignificant levels of distortion and noise.

It is therefore an object of the present invention to provide an improved mixing circuit for high power level signals.

Objects and advantages of the present invention may be ascertained from a reading of the specification and appended claims in conjunction with the single drawing which is a block diagram of the inventive concept.

DETAILED DESCRIPTION

In the present invention, an input signal at high power levels is applied to an input 10 which supplies signals to an IF filter 12. Filter 12 provides output signals on lead 14 to a coupler 16. The signals on lead 14 are passed substantially unaltered to an output lead 18 which supplies signals to a high power level mixer 20. Coupler 16 supplies output signals on a lead 22. The signals on lead 22 are an attenuated version of the signals on lead 14. Lead 22 supplies these attenuated signals to a low power level mixer 24. A local oscillator or mixer signal source supplies signals on a lead 26 to both of the mixers 20 and 24. Mixer 20 provides mixed signals as a result of the combination of the local oscillator signals and the high power input signals on a lead 28 to a further coupler 30 which has an output lead 32. Lead 32 contains substantially identical signals as those on lead 28. Coupler 30 also provides an attenuated version of the signals on lead 28 via a lead 34 to an adaptive canceller or combiner means 36. Mixer 24 provides a mixed signal substantially free from distortion on a lead 38 to a second input of canceller 36. Adaptive canceller 36 supplies signals on a lead 40 to an adaptive canceller or combining means 42 which has an output lead 44. The result of adaptively cancelling the signals in block 36 provides an output on lead 40 which comprises substantially only the distortion components found on the signals appearing on lead 34. Lead 32 is connected to a second input of adaptive canceller 42 for supplying high power level signals including distortion thereto. Amplification at the output of block 36 or the input of block 42 to adjust the signal levels may be necessary to obtain proper cancellation of signals. The output of the adaptive canceller on lead 44 contains the high power level signal without significant levels of distortion and noise.

OPERATION

While the operation is believed apparent from the above Detailed Description, it will be realized that all signals have some level of distortion and noise and that they become significant only when the percentage is great enough to create problems in the detection apparatus. However, by definition, the signal from the output of the IF filter 12 is considered substantially distortion and noise free, at least when comparing the absolute power levels of the original signal with the distortion and noise components. When this signal is combined in a high power level mixer of the type used in the present state of the art, an output is supplied on lead 28 which has a relatively high level of distortion components as compared with the primary resultant signal obtained as a result of the mixing operation. On the other hand, the attenuated version of the IF filtered signal appearing on lead 22 is of such a power level that a very small amount of distortion is supplied on lead 38. By adaptively combining these signals in canceller 36, the output on lead 40 comprises substantially only the distortion components found in the signals on lead 34. When these signals are changed in amplitude to be substantially identical to those found on lead 32, the adaptive canceller 42 removes the distortion components form the signals on lead 32 using the distortion components received on lead 40 and thus provides an output signal on lead 44 which percentage wise has a very small power level of distortion and noise components as compared to the primary signal. Thus, the label "signal only" attached to lead 44 is correct nomenclature for the application involved.

While only a single embodiment of the present inventive concept has been illustrated, it is to be realized that other specific circuits and block diagram combinations can be utilized to perform the concept of the present invention.

Therefore, I wish to be limited not by the specific embodiment shown but only by the scope of the appended claims wherein I claim:

1. Apparatus for reducing intermodulation distortion in high power level mixers comprising, in combination:
   oscillator means for supplying an oscillator signal;
   signal supply first means for supplying a high power level first signal to be mixed with said oscillator signal;
   mixer second means, connected to said first means and said oscillator means, for supplying a high power level second signal;
   coupler third means, associated with said first means, for supplying a low power level duplicate of said first signal as a third signal;
   mixer fourth means, connected to said third means and said oscillator means, for supplying a low power level fourth signal;
   coupler fifth means, associated with said second means, for supplying a low power level duplicate of said second signal as a low power level fifth signal;

combination sixth means, connected to said fourth and fifth means for receiving signals therefrom and outputting a difference sixth signal as a result of the combination; and combination seventh means, connected to receive said second and sixth signals and outputting a difference seventh signal as a result of the combination.

2. The method of reducing intermodulation distortion in a high power level mixer comprising the steps of:

mixing a source signal with a local oscillator signal to provide a high power level signal including primarily desired mixed signals and distortion signals;

mixing an attenuated version of the source signal with the local oscillator signal to provide a low power level signal including primarily a substantially distortion-free mixed signal;

combining an attenuated version of said high power level mixed signals plus distortion signals with the low power level, substantially distortion-free signal to provide an output comprising primarily distortion signal differences; and combining the high power level signal including primarily the mixed signals plus distortion signals with the signal comprising primarily distortion signals differences only to provide an output high level signal with relatively insignificant distortion signal levels.

3. Apparatus for reducing intermodulation distortion in high power level mixers comprising, in combination:

oscillator means for supplying a mixer signal;

signal supply first means for supplying a high power level first signal to be mixed with said mixer signal;

mixer second means, connected to said first means and said oscillator means, for supplying a high power level second signal including distortion;

coupler third means, associated with said first means, for supplying a low power level duplicate of said first signal as a third signal;

mixer fourth means, connected to said third means and said oscillator means, for supplying a low power level relatively distortion-free fourth signal;

coupler fifth means, associated with said second means, for supplying a low power level duplicate of said second signal as a low power level fifth signal including distortion;

combination sixth means, connected to said fourth and fifth means for receiving signals therefrom and outputting a difference sixth signal comprising primarily distortion signals as a result of the combination; and combination seventh means, connected to receive said second and sixth signals and outputting a difference seventh signal containing insignificant noise and distortion component levels as a result of the combination.

4. Apparatus for reducing intermodulation distortion in a high power level mixer comprising, in combination:

means for supplying high power level source and mixer signals;

first means for mixing said source signal with said mixer signal to provide a high power level resultant first signal including primarily desired mixed signals and distortion signals;

second means for mixing an attenuated version of said source signal with said mixer signal to provide a low power level second signal including primarily a substantially distortion-free mixed resultant signal;

third means for combining an attenuated version of said first signal with said second signal to provide an output third signal comprising primarily distortion signal differences; and fourth means for combining said high power level first signal with said third signal to provide a substantially distortion-free output high level fourth signal.

* * * * *